US011892498B2

(12) United States Patent
Ikebe et al.

(10) Patent No.: US 11,892,498 B2
(45) Date of Patent: Feb. 6, 2024

(54) RECEIVING DEVICE, MOBILE TERMINAL TEST APPARATUS PROVIDED WITH RECEIVING DEVICE, AND MOBILE TERMINAL TEST METHOD

(71) Applicant: ANRITSU CORPORATION, Kanagawa (JP)

(72) Inventors: Takasumi Ikebe, Kanagawa (JP); Kenji Goto, Kanagawa (JP); Mayfor Dangkiw, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 382 days.

(21) Appl. No.: 17/480,682

(22) Filed: Sep. 21, 2021

(65) Prior Publication Data

US 2022/0107354 A1    Apr. 7, 2022

(30) Foreign Application Priority Data

Oct. 7, 2020   (JP) ................................. 2020-169634

(51) Int. Cl.
| | | |
|---|---|---|
| G01R 31/28 | (2006.01) | |
| G01R 31/319 | (2006.01) | |
| G01R 29/26 | (2006.01) | |
| G01R 23/20 | (2006.01) | |

(52) U.S. Cl.
CPC ......... *G01R 31/2822* (2013.01); *G01R 23/20* (2013.01); *G01R 29/26* (2013.01); *G01R 31/31905* (2013.01)

(58) Field of Classification Search
CPC .................................................. G01R 31/2822
USPC ........................................................ 375/224
See application file for complete search history.

(56) References Cited

U.S. PATENT DOCUMENTS

2017/0163457 A1*   6/2017   Futatsugi ............ H04L 25/0307

FOREIGN PATENT DOCUMENTS

JP       2019-153963 A       9/2019

* cited by examiner

*Primary Examiner* — Lihong Yu
(74) *Attorney, Agent, or Firm* — Pearne & Gordon, LLP

(57) ABSTRACT

A receiving device includes a reception unit that samples a sample signal from a DUT 2; an FFT processing unit 21 that performs an FFT process by multiplying the sample signal by a window function; an FFT length setting unit 34 that, when the signal length of the signal to be measured is shorter than the first FFT length conforming to the communication standard, instead of the first FFT length, sets a second FFT length shorter than the signal length of the signal to be measured, as an FFT length of the FFT process; and a window function setting unit 35 that, when the signal length of the signal to be measured is shorter than the first FFT length, instead of a first window function, sets an asymmetric second window function having a peak separated from a center of a window section, as the window function.

15 Claims, 11 Drawing Sheets

RECEIVING DEVICE, MOBILE TERMINAL TEST APPARATUS PROVIDED WITH RECEIVING DEVICE, AND MOBILE TERMINAL TEST METHOD

TECHNICAL FIELD

The present invention relates to a receiving device, a mobile terminal test apparatus provided with the receiving device, and a mobile terminal test method.

BACKGROUND ART

In the related art, a transmission test for analyzing a signal transmitted from a Device Under Test (DUT) such as a mobile communication terminal and checking the transmission performance of the DUT has been performed using a mobile terminal test apparatus. The signal transmitted from the DUT is a modulation signal modulated according to a communication standard such as a wireless Local Area Network (LAN), Long Term Evolution (LTE), or 5G New Radio (NR).

In wideband wireless transmission systems such as wireless LAN, LTE, and 5G NR, the Orthogonal Frequency Division Multiplexing (OFDM) method having a good frequency utilization efficiency is widely used as the modulation method. The OFDM method is a block transmission method that synchronizes every predetermined data block. Specifically, the data sequence is demultiplexed on the transmitting side, converted into parallel data, mapped to each subcarrier, and then an Inverse Fast Fourier Transform (IFFT) process, D/A transformation, orthogonal modulation, or the like are performed to obtain a transmission signal. In addition, after conversion to a signal in the time domain by an IFFT process, a part of the rear end of the signal is added to the front of the signal as a guard interval to make it resistant to inter-symbol interference due to multipath fading.

The mobile terminal test apparatus receives the modulation signal generated in this manner, demodulates the modulation signal, and performs signal analysis. In the demodulation, a Fast Fourier Transform (FFT) process is performed (see, for example, Patent Document 1).

Patent Document 1 discloses an apparatus that receives a signal transmitted from a DUT, performs an FFT process on the received signal, analyzes the received signal, and measures transmission characteristics such as transmission power and modulation accuracy.

RELATED ART DOCUMENT

Patent Document

[Patent Document 1] JP-A-2019-153963

DISCLOSURE OF THE INVENTION

Problem that the Invention is to Solve

Generally, in a DUT transmission test, a signal having a predetermined signal length conforming to the communication standard is subjected to an FFT process and analyzed to measure the transmission characteristics of the DUT. In the FFT process, the signal to be measured is multiplied by the window function to cut out the signal, and the FFT operation is performed on the signal portion. However, there are cases where it is desired to perform an FFT process and analyze a signal having a short signal length that does not conform to the communication standard to measure the transmission characteristics of the DUT.

In this FFT process, the FFT Length is uniquely determined by the Uplink Bandwidth and the Subcarrier Spacing specified in the communication standard. Therefore, for example, when the measurement target is a Physical Uplink Shared CHannel (PUSCH) and the number of symbols is small, the number of samples of the PUSCH to be measured may be smaller than the FFT length. In other words, the signal length of the signal to be measured may be shorter than the section width (domain width) of the window function used in the FFT process. As a result, there is a problem that in the FFT process, an appropriate result with high reliability cannot be obtained and a measurement error occurs. For example, in the power measurement, a value smaller than expected is obtained.

In order to solve this problem, a method of shortening the FFT length has been considered, but since the signal length of the signal to be measured is also short outside the standard, the number of FFT sweeps is reduced, so that the cut-out by the window function is biased depending on the location, and even when the averaging process is performed, a highly reliable FFT result cannot be obtained. Therefore, for example, there is a problem that the power measurement result differs between when the spectrum measurement function is turned on and when it is turned off.

However, in the apparatus in the related art described in Patent Document 1, when the signal to be measured is short and the FFT length is shortened accordingly, the number of FFT sweeps is reduced, accurate measurement cannot be performed even by averaging. In particular, the problem of a difference in the power measurement result when the spectrum measurement is ON/OFF has not been considered.

The present invention has been made to solve the above-described problems in the related art, and an object of the present invention is to provide a receiving device, a mobile terminal test apparatus provided with the receiving device, and a mobile terminal test method that are capable of handling a case where the signal length of a signal to be measured is short outside the standard in a test involving an FFT process, and performing the FFT process with high reliability.

Means for Solving the Problem

In order to achieve the above object, a receiving device of the present invention includes a reception unit (10) that samples a signal to be measured (a) transmitted from a device under test (2) and acquires a sample signal (d); an FFT processing unit (21) that performs an FFT process by multiplying the sample signal acquired by the reception unit by a window function; a signal length calculation unit (31) that calculates a signal length of the signal to be measured from the sample signal acquired by the reception unit; a comparing unit (33) that compares the calculated signal length of the signal to be measured with a first FFT length conforming to a communication standard; an FFT length setting unit (34) that when as a result of the comparison by the comparing unit, the signal length of the signal to be measured is shorter than the first FFT length, instead of the first FFT length, sets a second FFT length shorter than the signal length of the signal to be measured, as an FFT length of the FFT process by the FFT processing unit; and a window function setting unit (35) that, when as the result of the comparison by the comparing unit, the signal length of the signal to be measured is shorter than the first FFT length, instead of a first window function which is currently set as the window function used in the FFT process, sets an asymmetric second window function having a peak separated from a center of a window section, as the window function used in the FFT process.

As described above, in the receiving device of the present invention, when the signal length of the signal to be measured is shorter than the first FFT length conforming to the communication standard, instead of the first FFT length, the FFT length setting unit may set a second FFT length that is shorter than the signal length of the signal to be measured and is outside the standard, as the FFT length of the FFT process by the FFT processing unit. Further, when the signal length of the signal to be measured is shorter than the first FFT length, instead of a first window function used in the FFT process, the window function setting unit may set an asymmetric second window function having a peak separated from a center of a window section, as a window function used in the FFT process. With this configuration, for example, a section (section deviated from the main lobe portion) that has not been subjected to substantially FFT on the start point side (left end side) of the symmetrical first window function is also substantially subjected to FFT by using an asymmetric second window function having a peak separated the start point side (left end side). Thus, the receiving device of the present invention is able to, in a test involving the FFT process, handle not only a signal to be measured conforming to the communication standard but also a case where the signal length of a signal to be measured is short outside the standard, and perform the FFT process with high reliability.

Further, in the receiving device of the present invention, a separation distance of the peak of the second window function from the center of the window section may be the number of N samples indicated by the following expression, $$N = WL - \frac{3}{RBW} \times SamplingRate \quad (1)$$

where WL is a section length of the second window function, RBW is a resolution bandwidth of the second window function, and SamplingRate is a rate of the sampling by the reception unit.

It is known that if the window function is equal to or greater than the number of N samples indicated by the above expression, FFT can be performed without any problem in practical use. Therefore, in the window section, even if the window function is translated to the left side by the number of N samples shown in the above expression and zero padding (0 padding) is performed on the part on the right side where there is no possible function value, FFT can be performed without any problem in practical use. With this configuration, a highly reliable FFT can be performed by the asymmetric second window function that is maximally separated from the center of the window section.

Further, in the receiving device of the present invention, the FFT processing unit may perform the FFT process while shifting the set window function within an FFT sweep section, and the receiving device may further include an FFT sweep section setting unit (36) that when as the result of the comparison by the comparing unit, the signal length of the signal to be measured is shorter than the first FFT length, sets a section obtained by extending a measurement section corresponding to the signal to be measured, as the FFT sweep section.

As described above, when as the result of the comparison by the comparing unit, the signal length of the signal to be measured is shorter than the first FFT length, the FFT sweep section setting unit may set a section obtained by extending a measurement section corresponding to the signal to be measured, as an FFT sweep section. When shifting the second window function to the end point side (right end side) during FFT sweep, the value of the zero padded part on the right side is 0, so that the FFT result is not affected even if this part exceeds the measurement section. With this configuration, a substantially effective FFT can be performed up to the right end of the measurement section. Thus, the receiving device of the present invention is able to, in a test involving the FFT processing, handle not only a signal to be measured conforming to the communication standard but also a case where the signal length of a signal to be measured is short outside the standard, and perform the FFT process with high reliability, regardless of whether the spectrum measurement function is used or not.

Further, in the receiving device of the present invention, the FFT processing unit may perform the FFT process while shifting the set window function within an FFT sweep section, and the receiving device may further include an FFT sweep section setting unit that when as the result of the comparison by the comparing unit, the signal length of the signal to be measured is shorter than the first FFT length, sets a section obtained by extending a measurement section corresponding to the signal to be measured, as the FFT sweep section.

Further, in the receiving device of the present invention, the FFT sweep section obtained by extending the measurement section may be a section obtained by extending the measurement section from an end point of the measurement section, by a difference obtained by subtracting a value twice a section length from a start point to a peak point of the second window function, from a section length of the second window function.

With this configuration, it is possible to perform a substantially effective FFT evenly from the start point (left end) to the end point (right end) of the measurement section.

Further, in the receiving device of the present invention, the FFT length setting unit may set the second FFT length to maximum $2^n$ which is the number of samples or less of one symbol at a sampling rate of the sampling performed by the reception unit, where n is a natural number.

With this configuration, even when the signal length of the signal to be measured is only one symbol at worst, the FFT process can be appropriately performed. Further, since the second FFT length can be set to the shortest, the number of FFT sweeps can be increased.

Further, a mobile terminal test apparatus of the present invention includes a receiving device including a reception unit (10) that samples a signal to be measured (a), transmitted from a device under test (2), and acquires a sample signal (d), an FFT processing unit (21) that performs an FFT process by multiplying the sample signal acquired by the reception unit by a window function, a signal length calculation unit (31) that calculates a signal length of the signal to be measured from the sample signal acquired by the reception unit, a comparing unit (33) that compares the calculated signal length of the signal to be measured with a first FFT length conforming to a communication standard, an FFT length setting unit (34) that when as a result of the comparison by the comparing unit, the signal length of the signal to be measured is shorter than the first FFT length, instead of the first FFT length, sets a second FFT length shorter than the signal length of the signal to be measured, as an FFT length of the FFT process by the FFT processing unit, and a window function setting unit (35) that when as the result of the comparison by the comparing unit, the signal length of the signal to be measured is shorter than the first FFT length, instead of a first window function which is currently set as the window function used in the FFT process, sets an asymmetric second window function having a peak separated from a center of a window section, as the window function used in the FFT process; an analysis unit (40) that analyzes a signal obtained by the FFT processing unit; and a display unit (50) that displays a result of the analysis performed by the analysis unit.

As described above, in the mobile terminal test apparatus of the present invention, when the signal length of the signal to be measured is shorter than the first FFT length conforming to the communication standard, instead of the first FFT length, the FFT length setting unit of the receiving device may set a second FFT length that is shorter than the signal length of the signal to be measured and is outside the standard, as the FFT length of the FFT process by the FFT processing unit. Further, when the signal length of the signal to be measured is shorter than the first FFT length, instead of a first window function used in the FFT process, the window function setting unit of the receiving device may set an asymmetric second window function having a peak separated from a center of a window section, as a window function used in the FFT process. With this configuration, for example, a section (section deviated from the main lobe portion) that has not been subjected to substantially FFT on the start point side (left end side) of the symmetrical first window function is also substantially subjected to FFT by using a second window function having a peak separated the start point side (left end side).

Further, when the receiving device includes the FFT sweep section setting unit, when as the result of the comparison by the comparing unit, the signal length of the signal to be measured is shorter than the first FFT length, the FFT sweep section setting unit may set a section obtained by extending a measurement section corresponding to the signal to be measured, as an FFT sweep section. When shifting the second window function to the right side during FFT sweep, the value of the zero padded part on the right side is 0, so that the FFT result is not affected even if this part exceeds the measurement section. With this configuration, a substantially effective FFT can be performed up to the right end of the measurement section.

Therefore, the mobile terminal test apparatus of the present invention is able to, in a test involving the FFT process, handle not only a signal to be measured conforming to the communication standard but also a case where the signal length of a signal to be measured is short outside the standard, and perform the FFT process with high reliability, regardless of whether the spectrum measurement function is used or not, thereby accurately testing the mobile communication terminal.

Further, in the mobile terminal test apparatus of the present invention, a separation distance of the peak of the second window function from the center of the window section may be the number of N samples indicated by the following expression, $$N = WL - \frac{3}{RBW} \times SamplingRate$$

where WL is a section length of the second window function, RBW is a resolution bandwidth of the second window function, and SamplingRate is a rate of the sampling by the reception unit.

Further, in the mobile terminal test apparatus of the present invention, the FFT processing unit may perform the FFT process while shifting the set window function within an FFT sweep section, and the receiving device may further include an FFT sweep section setting unit that when as the result of the comparison by the comparing unit, the signal length of the signal to be measured is shorter than the first FFT length, sets a section obtained by extending a measurement section corresponding to the signal to be measured, as the FFT sweep section.

Further, in the mobile terminal test apparatus of the present invention, the FFT sweep section obtained by extending the measurement section may be a section obtained by extending the measurement section from an end point of the measurement section, by a difference obtained by subtracting a value twice a section length from a start point to a peak point of the second window function, from a section length of the second window function.

Further, in the mobile terminal test apparatus of the present invention, the FFT length setting unit may set the second FFT length to maximum $2^n$ which is the number of samples or less of one symbol at a sampling rate of the sampling performed by the reception unit, where n is a natural number.

Further, a mobile terminal test method of the present invention includes a reception step (S2 to S5) of sampling a signal to be measured (a) transmitted from a device under test (2) and acquiring a sample signal (d); an FFT processing step (S7) of performing an FFT process by multiplying the sample signal acquired in the reception step by a window function; a signal length calculation step (S22) of calculating a signal length of the signal to be measured from the sample signal acquired in the reception step; a comparison step (S23) of comparing the calculated signal length of the signal to be measured with a first FFT length conforming to a communication standard as an FFT length of the FFT process; an FFT length setting step (S24) of, when as a result of the comparison in the comparison step, the signal length of the signal to be measured is shorter than the first FFT length, instead of the first FFT length, setting a second FFT length shorter than the signal length of the signal to be measured, as the FFT length of the FFT process in the FFT processing step; a window function setting step (S25) of, when as the result of the comparison in the comparison step, the signal length of the signal to be measured is shorter than the first FFT length, instead of a first window function which is currently set as the window function used in the FFT process, setting an asymmetric second window function having a peak separated from a center of a window section, as the window function used in the FFT process; a sweep section setting step (S26) of, when as the result of the comparison in the comparison step, the signal length of the signal to be measured is shorter than the first FFT length, setting a section obtained by extending a measurement section corresponding to the signal to be measured, as an FFT sweep section; an analysis step (S9) of analyzing a signal obtained in the FFT processing step; and a display step (S10) of displaying a result of analysis in the analysis step.

As described above, in the mobile terminal test method of the present invention, in the FFT length setting step, when the signal length of the signal to be measured is shorter than the first FFT length conforming to the communication standard, instead of the first FFT length, a second FFT length that is shorter than the signal length of the signal to be measured and is outside the standard may be set as the FFT length of the FFT process in the FFT processing step. Further, in the window function setting step, when the signal length of the signal to be measured is shorter than the first FFT length, instead of a first window function used in the FFT process, an asymmetric second window function having a peak separated from a center of a window section may be set as a window function used in the FFT process. With this configuration, for example, a section (section deviated from the main lobe portion) that has not been subjected to substantially FFT on the start point side (left end side) of the symmetrical first window function is also substantially subjected to FFT by using an asymmetric second window function having a peak separated the start point side (left end side).

When shifting the second window function to the end point side (right end side) during FFT sweep, the value of the zero padded part on the right side is 0, so that the FFT result is not affected even if this part exceeds the measurement section. Thus, a substantially effective FFT can be performed up to the right end of the measurement section. Thus, in a test involving the FFT process, it is possible to handle not only a signal to be measured conforming to the communication standard but also a case where the signal length of a signal to be measured is short outside the standard, and perform the FFT process with high reliability, regardless of whether the spectrum measurement function is used or not, thereby accurately testing the mobile communication terminal.

Advantage of the Invention

According to the present invention, it is possible to provide a receiving device, a mobile terminal test apparatus provided with the receiving device, and a mobile terminal test method that can handle a case where the signal length of a signal to be measured is short outside the standard in a test involving an FFT process and perform an FFT process with high reliability.

BRIEF DESCRIPTION OF THE DRAWINGS

FIG. 5B is a diagram illustrating a relationship between the signal to be measured and the window function when the spectrum measurement function is ON.

BEST MODE FOR CARRYING OUT THE INVENTION

Hereinafter, embodiments of the present invention will be described with reference to the drawings.

Figure 1:
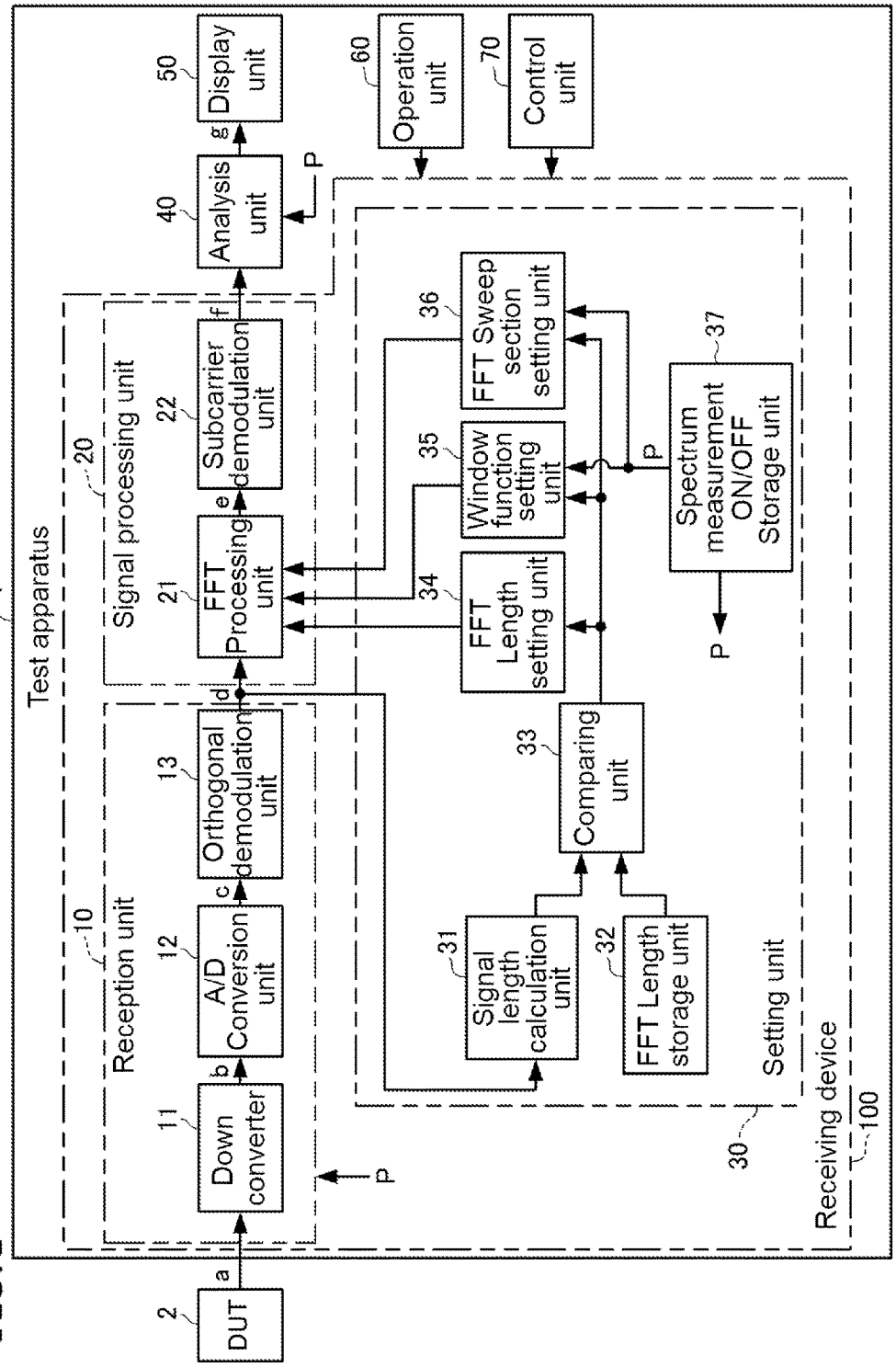
FIG. 1 is a block diagram illustrating a configuration of a mobile terminal test apparatus according to an embodiment of the present invention.

A mobile terminal test apparatus 1 (hereinafter, also referred to as a test apparatus) according to the embodiment of the present invention tests the transmission performance of a device under test (DUT) 2 by receiving the modulation signal a transmitted from the DUT 2 and performing an FFT process on the received modulation signal to analyze it. For this purpose, as shown in FIG. 1, the test apparatus 1 includes a reception unit 10, a signal processing unit 20, a setting unit 30, an analysis unit 40, a display unit 50, an operation unit 60, and a control unit 70. The portion including the reception unit 10, the signal processing unit 20, and the setting unit 30 is also referred to as a receiving device 100. The test apparatus 1 may be, for example, a signal analyzer or a spectrum analyzer as long as it utilizes an FFT process.

Examples of the DUT 2 include, but are not limited to, mobile communication terminals such as smartphones, mobile phones, and tablet terminals. The modulation signal a transmitted from the DUT 2 is an OFDM modulation signal modulated by, for example, an orthogonal frequency division multiplexing (OFDM) method according to a communication standard such as LTE, LTE-Advanced, 5G NR, or wireless LAN. The modulation signal a is also referred to as a signal to be measured. In the present embodiment, 5G NR is assumed as the communication standard, and the modulation signal modulated by the OFDM method is received, but the communication standard and the modulation method are not limited to this. Hereinafter, each component will be described.

(Reception Unit)

The reception unit 10 receives the modulation signal a (OFDM modulation signal) transmitted from the DUT 2 via an antenna or by wire, and performs frequency conversion and samples the received modulation signal. Specifically, the reception unit 10 includes a down converter 11, an analog-to-digital conversion unit (A/D conversion unit) 12, and an orthogonal demodulation unit 13.

The down converter 11 includes a mixer and a local oscillator, inputs the modulation signal a transmitted from the DUT 2 and the local signal generated by the local oscillator to the mixer, down-converts the input signals, and generates an intermediate frequency (IF) signal b. The intermediate frequency signal b is sent to the A/D conversion unit 12.

The A/D conversion unit 12 samples the intermediate frequency signal b, which is frequency-converted by the down converter 11, and converts the sampled intermediate frequency signal b from an analog signal to a digital signal. An obtained digital intermediate frequency signal c is sent to the orthogonal demodulation unit 13.

The orthogonal demodulation unit 13 frequency-converts the digital intermediate frequency signal c output from the A/D conversion unit 12 into a baseband signal, and orthogonally demodulates the intermediate frequency signal c into an I-phase component and a Q-phase component. The obtained orthogonal demodulation signal d is sent to the signal processing unit 20 and the setting unit 30. The orthogonal demodulation signal d is a complex signal and is also referred to as a sample signal or a sample sequence.

In the above description, in the reception unit 10, the modulation signal is converted into an intermediate frequency signal by the down converter 11, but may be converted into a baseband signal by the down converter 11. Further, a signal synchronization unit may be provided between the orthogonal demodulation unit 13 and the signal processing unit 20, and symbols or frames may be synchronized with respect to the orthogonal demodulation signal d.

As will be described in detail later, the setting unit 30 sets or changes parameters that specify the FFT process performed by the FFT processing unit 21 of the signal processing unit 20.

(Signal Processing Unit)

The signal processing unit 20 performs OFDM demodulation on the orthogonal demodulation signal d output from the orthogonal demodulation unit 13 of the reception unit 10. Specifically, the signal processing unit 20 includes an FFT processing unit 21 and a subcarrier demodulation unit 22.

The FFT processing unit 21 performs an FFT process by multiplying the orthogonal demodulation signal d (sample signal) acquired by the reception unit 10 by a window function to generate a frequency domain signal e. Specifically, the FFT processing unit 21 performs the FFT operation while shifting the window function in a predetermined sweep section (FFT sweep). Parameters or conditions that specify the FFT process include an FFT length, a window function, a resolution bandwidth (RBW) of the window function, an FFT sweep method, and the like. All or part of these FFT processing conditions may be initially set in the FFT processing unit 21, with the conditions specified in the communication standard as the default, or may be input by the user operating the operation unit 60. As the window function, any type of window function such as a Gaussian window can be used.

If necessary, Cyclic Prefix (CP) is removed from each symbol of the orthogonal demodulation signal d, before the FFT process is performed by the FFT processing unit 21. The frequency domain signal e generated by the FFT processing unit 21 is sent to the subcarrier demodulation unit 22, and, if necessary, the analysis unit 40.

A transmission line estimation and transmission line correction unit may be provided between the FFT processing unit 21 and the subcarrier demodulation unit 22. The transmission line estimation and transmission line correction unit corrects the transmission line by estimating the transmission line using, for example, a pilot signal, with respect to the frequency domain signal e output from the FFT processing unit 21. When the transmission line estimation and transmission line correction unit is provided, the corrected frequency domain signal is sent to the subcarrier demodulation unit 22.

The subcarrier demodulation unit 22 performs a demodulation process on the frequency domain signal e for each subcarrier to generate an OFDM demodulation signal f. The OFDM demodulation signal f is sent to the analysis unit 40.

(Analysis Unit)

The analysis unit 40 is configured to measure and analyze, for example, transmission power, Error Vector Magnitude (EVM), constellation, spectrum, or the like, with respect to the OFDM demodulation signal f output from the subcarrier demodulation unit 22, and test the transmission performance of the DUT 2. The information g on the measurement and analysis result by the analysis unit 40 is sent to the display unit 50.

(Display Unit or the Like)

The display unit 50 includes a display device such as a liquid crystal display, and displays, on the display device, the test result of the DUT 2, including data and graphs of the measurement and analysis result sent from the analysis unit 40.

The operation unit 60 is operated by the user to set various parameters in addition to the measurement items, measurement conditions, and determination conditions when testing the DUT 2. Specifically, examples of the operation unit 60 include an input device such as a touch panel, a keyboard composed of hardware keys, a mouse or a dial, and a control circuit for controlling these.

The control unit 70 receives an input from the operation unit 60, sets various parameters, and controls functional units such as the reception unit 10, the signal processing unit 20, the setting unit 30, the analysis unit 40, and the display unit 50.

(Setting Unit)

Next, the setting unit 30 will be described with reference to the drawings.

The setting unit 30 sets parameters that specify the FFT process performed by the FFT processing unit 21 of the signal processing unit 20. Specifically, as shown in FIG. 1, the setting unit 30 includes a signal length calculation unit 31, an FFT length storage unit 32, a comparing unit 33, an FFT length setting unit 34, a window function setting unit 35, an FFT sweep section setting unit 36, and a spectrum measurement ON/OFF storage unit 37.

<FFT Process>

First, the FFT process performed by the FFT processing unit 21 will be described.

The orthogonal demodulation signal d output from the orthogonal demodulation unit 13 is time-series (time domain) sample sequences $S(1), \ldots, S(N)$ acquired at the sampling rate SR by the A/D conversion unit 12. Here, N is a natural number. Each sample $S(k)$ is a complex number having an I-phase component and a Q-phase component. Here, k is a sample number, which is a natural number of $1 \leq k \leq N$. The total time length of the time-series sample sequences $S(1), \ldots, S(N)$ is set to T1 (see FIG. 2). Since the sampling rate SR is constant, the time, time length, and section length may be expressed by the number of samples below.

The FFT processing unit 21 performs an FFT process on the sample sequence $S(k)$ having a time length T1. In the FFT process, the sample sequence $S(k)$ having the time length T1 is multiplied by the window function $w(t)$ having the section length T2 to cut out the signal. Here, the time t is associated with the sample number m and can be expressed as $t(m)$. The cut-out data sequence $d(m)$ of the time length T2 is expressed by the following expression.

$$d(m) = S(m) \cdot w(t(m)), 1 \leq m \leq M \leq N$$

Here, m is a natural number, and M is the number of data pieces in the cut-out data sequence. The multiplication of the sample signal (sample sequence) and the window function on the time axis corresponds to the convolution calculation of the sample signal and the window function on the frequency axis.

In general, the section length T2 of the window function w is equal to the FFT length. That is, when the number of samples included in the section length T2 of the window function w is M, the FFT length is equal to the number of M samples.

A known FFT operation is performed on the cut-out data sequence d(m) of the time length T2 to obtain the data sequence D(ωm) on the frequency domain. That is, the components of the fundamental wave (ω1) and its harmonics (ω2, ..., ωM) are obtained.

Figure 2:
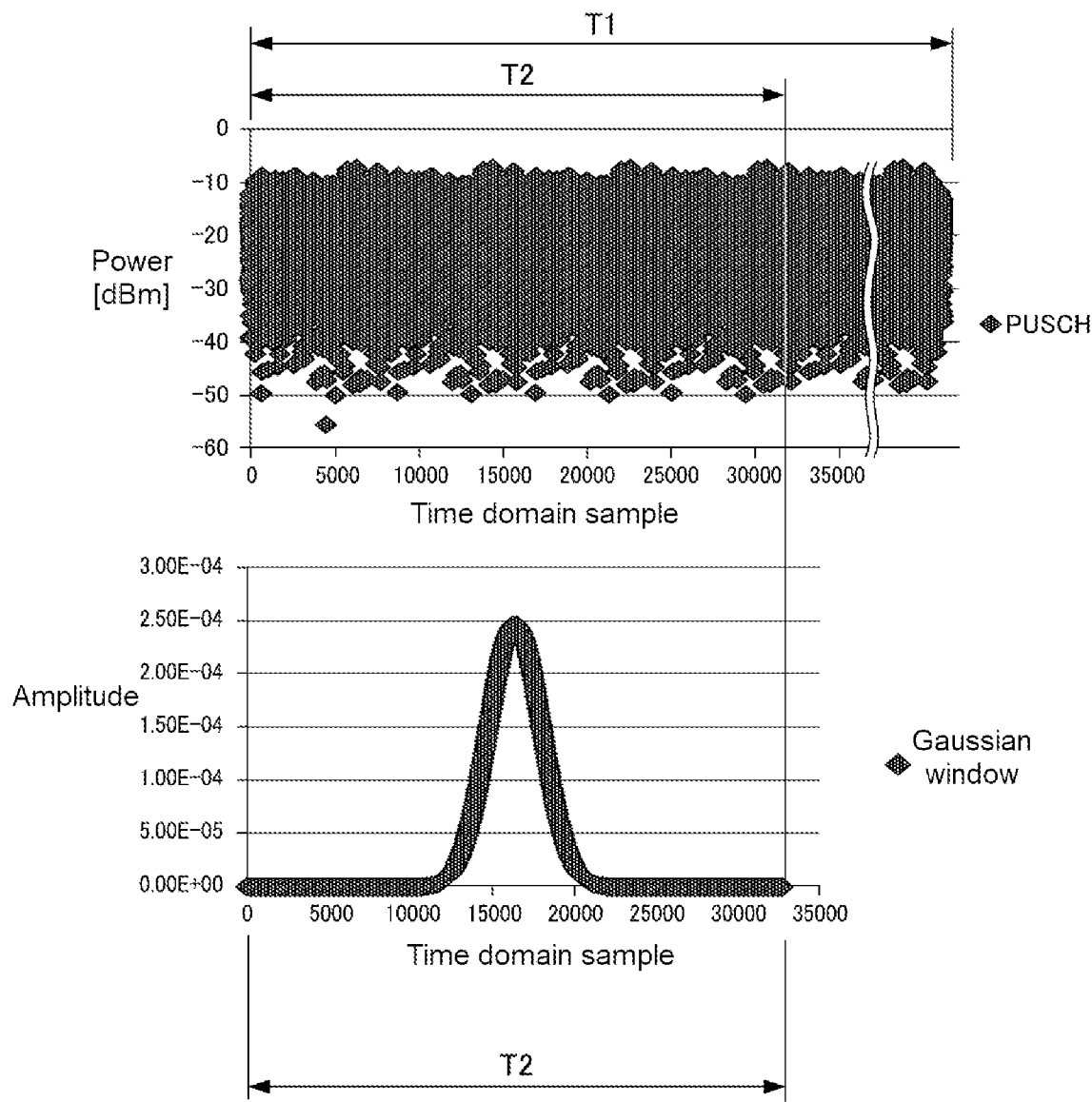
FIG. 2 is a diagram illustrating a relationship between a signal to be measured conforming to the communication standard and a window function.

FIG. 2 is a diagram illustrating a relationship between a signal to be measured (upper graph) conforming to the communication standard and a window function (lower graph) conforming to the communication standard. In the example of FIG. 2, the signal to be measured is a PUSCH signal, and the window function is a Gaussian window. The time length T1 of the sample sequence (or symbol sequence) constituting the signal to be measured transmitted from the DUT 2 is greater than the section length T2 of the window function. In FIG. 2, the number of samples on the horizontal axis is scaled in the upper and lower graphs. As shown in FIG. 2, the part of the sample sequence corresponding to the main lobe of the window function is a region where substantial data having power equal to or higher than the reference value is present. Therefore, the signal can be cut out satisfactorily by multiplying the partial sample sequence of the time length T2 by the window function of the section length T2.

In this way, when T1 (time length of the signal to be measured)>T2 (section length of the window function), the cutout and FFT operation of a signal are repeated, while shifting the position (sample number) in the sample sequence S(k) for multiplying the window function. Such a process is also referred to as FFT sweep. The sweep is started when the start point (left end) of the window function matches the start point of the section (measurement section) of the sample sequence, the FFT operation is performed while shifting the window function to the right at a predetermined interval d, and when the end point (right end) of the window function is reached the end point of the measurement section, the process ends. The shift of the window function in the FFT sweep may be performed while overlapping the window functions or may be performed without overlapping the window functions.

Figure 3:
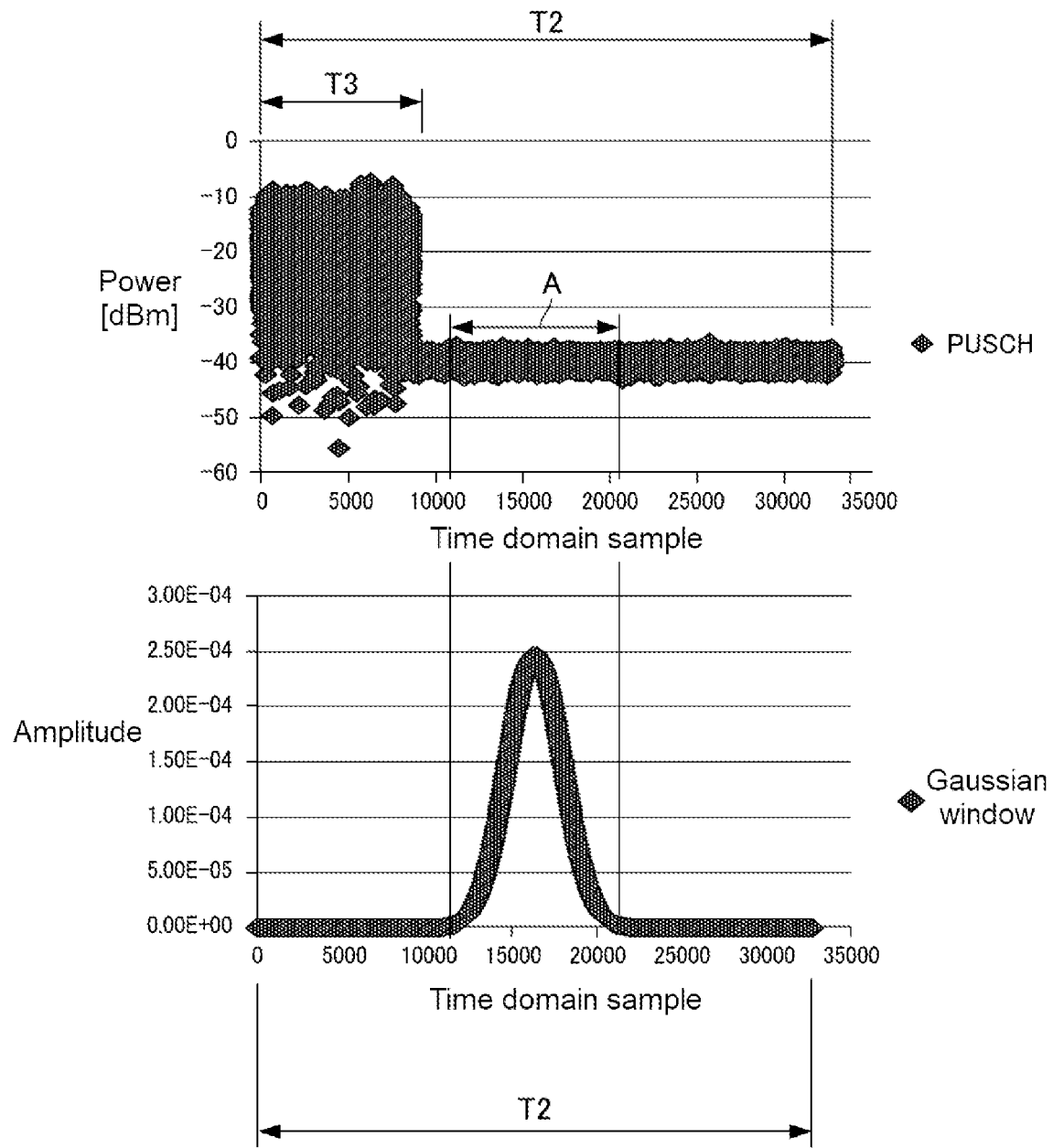
FIG. 3 is a diagram illustrating a relationship between a signal to be measured that does not conform to the communication standard and the window function.

FIG. 3 is a diagram illustrating a relationship between the signal to be measured (upper graph) that does not conform to the communication standard and the window function (lower graph). In the example of FIG. 3, the signal to be measured is a PUSCH signal, and the window function is a Gaussian window. The case where the time length T3 of the sample sequence constituting the signal to be measured transmitted from the DUT 2 is shorter than the section length T2 (that is, the FFT length) of the window function is shown. In FIG. 3, the number of samples on the horizontal axis is scaled in the upper and lower graphs.

As described above, in the FFT process, the window function is applied to the signal to be measured, before performing the FFT operation. In the case of FIG. 3, there is substantially no signal in the part A of the signal to be measured corresponding to the main lobe portion of the window function, that is, the part A is a region where there is no substantial data having power equal to or higher than the reference value in the signal to be measured. Therefore, a region in which there is no substantial data is cut out, by multiplying the partial sample sequence of the time length T2 by the window function of the section length T2. By performing such multiplication, the section where there is substantially no signal to be measured is subject to FFT. Thus, for example, the power measurement result is about the noise floor or becomes smaller than the expected value. Such a phenomenon occurs because the FFT length is larger than the signal length of the signal to be measured.

Figure 4:
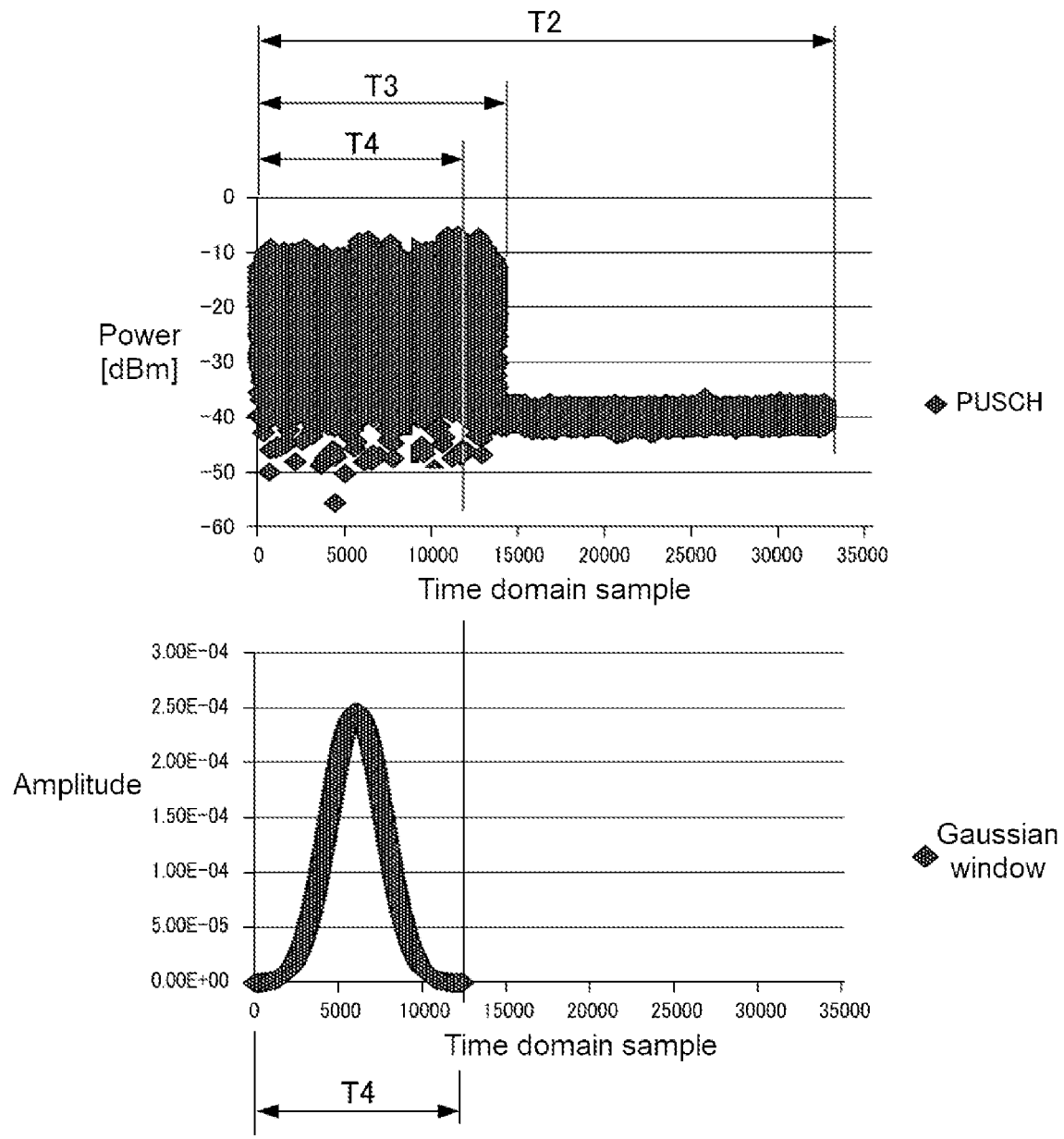
FIG. 4 is a diagram illustrating a window function used for the signal to be measured that does not conform to the communication standard in the embodiment of the present invention.

FIG. 4 is a diagram illustrating a window function used for the signal to be measured that does not conform to the communication standard in the embodiment of the present invention. When the time length T3 of the signal to be measured transmitted from DUT 2 is shorter than the section width T2 (that is, the first FFT length) of the window function, the window function is changed to a window function having a section length T4 shorter than the time length T3 of the signal to be measured. In other words, when the signal length T3 of the signal to be measured is shorter than the first FFT length T2, a second FFT length T4 that is outside the standard and is shorter than the signal length of the signal to be measured is adopted instead of the first FFT length.

Hereinafter, the components of the setting unit 30 will be described.

The signal length calculation unit 31 calculates the signal length of the signal to be measured from the orthogonal demodulation signal d (also referred to as a sample signal) acquired by the reception unit 10. Specifically, the signal length calculation unit 31 compares the power of each sample of the orthogonal demodulation signal d with a predetermined reference value, and determines that the signal is a substantial signal transmitted from the DUT 2 when the power is larger than the reference value. For example, in FIG. 3, the signal length of the signal to be measured is T3 [sample].

The FFT length storage unit 32 stores a predetermined first FFT length specified in the communication standard, as the FFT length of the FFT process applied to the sample signal acquired by the reception unit 10. For example, in FIG. 2, the first FFT length is T2 [sample].

The comparing unit 33 compares the signal length of the signal to be measured calculated by the signal length calculation unit 31 with the first FFT length stored in the FFT length storage unit 32. For example, in FIG. 2, T1 which is the signal length of the signal to be measured is compared with T2 which is the first FFT length. For example, in FIG. 3, T3 which is the signal length of the signal to be measured is compared with T2 which is the first FFT length.

When as a result of the comparison by the comparing unit 33, the signal length of the signal to be measured is shorter than the first FFT length, the FFT length setting unit (34) sets, instead of the first FFT length, a second FFT length which is shorter than the signal length of the signal to be measured and is outside the standard, as the FFT length of the FFT process by the FFT processing unit 21. For example, as shown in FIG. 3, when T3 which is the signal length of the signal to be measured is shorter than T2 which is the first FFT length, as shown in FIG. 4, a second FFT length T4 which is shorter than the signal length T3 of the signal to be measured is set as the FFT length of the FFT process in the FFT processing unit 21.

As described above, when the number of samples (signal length) of the I-phase component or Q-phase component of the signal to be measured is smaller than the FFT length (first FFT length) of the FFT process specified in the communication standard, the FFT length is shortened. The value of the FFT length adopted at that time is adjusted to the worst case (that is, at one symbol).

Specifically, the FFT length setting unit 34 sets the second FFT length to maximum $2^n$ (power of 2) which is the number of samples or less of one symbol at the sampling rate of the sampling performed by the reception unit 10. Where n is a natural number. With this configuration, even when the signal length of the signal to be measured is only one symbol at worst, the FFT process can be appropriately performed. Further, since the second FFT length can be set to the shortest, the number of FFT sweeps can be increased.

Here, the window function will be described.

As the window function w(t), for example, the following Gaussian window wG(t) is used.

$$w_G(t) = \exp\left\{-\frac{t^2}{2\sigma^2}\right\} \quad (2)$$

Where σ is the standard deviation.

The following expression is obtained by Fourier transforming Gaussian window wG(t).

$$W_G(\omega) = \sqrt{2}\,\sigma \cdot \exp\left\{-\frac{(\omega\sigma)^2}{2}\right\} \quad (3)$$

If RBW is defined by −3 dB bandwidth, the following expression is obtained from Expression (3).

$$\exp\left\{-\frac{(\omega\sigma)^2}{2}\right\} = \frac{1}{\sqrt{2}} \quad (4)$$

Further, ω that drops by −3 dB is given by the following expression.

$$\omega_c = 2\pi \frac{RBW}{2} = \pi \cdot RBW \quad (5)$$

The following expression is obtained from Expressions (4) and (5).

$$\sigma = \frac{\sqrt{\ln 2}}{\pi \cdot RBW} \quad (6)$$

(Window Function Setting Unit)

Figure 6:
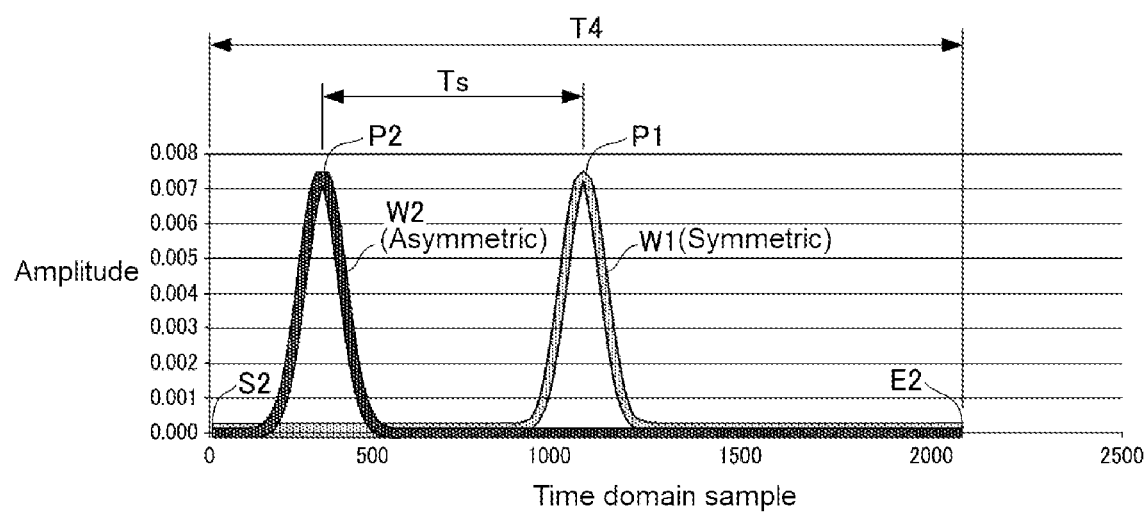
FIG. 6 is a diagram illustrating a window function used for an FFT in the embodiment of the present invention.

FIG. 6 is a diagram for explaining a window function set by the window function setting unit 35 in the present embodiment. As shown in FIG. 6, when as the result of the comparison by the comparing unit 33, the signal length of the signal to be measured is shorter than the first FFT length, the window function setting unit 35 sets, instead of a first window function currently set as a window function used in the FFT process, an asymmetric second window function W2 having a peak P2 separated from the center of a window section to the start point S2 side (left end side), as a window function used in the FFT process. The section length of the window section of the second window function W2 is T4, and the left end of the second window function W2 or the window section thereof is referred to as a start point S2 and the right end is referred to as an end point E2.

In FIG. 6, for reference, a window function W1 symmetrical with respect to the center of the same window section is shown. The window function W1 may be the first window function described above. In the second window function W2, the symmetrical window function W1 shown as a reference is translated to the left, and the main lobe portion is also moved to the left. As a result of translation, the portion on the left side of the main lobe portion of the second window function W2 is narrower, and the portion on the right side is wider due to zero padding.

The separation distance Ts from the center of the window section of the peak P2 of the second window function W2 is the number of N samples indicated by the following expression.

$$N = WL - \frac{3}{RBW} \times SamplingRate \quad (7)$$

Where, WL is the section length T4 of the second window function W2, RBW is the resolution bandwidth of the second window function W2, and SamplingRate is the sampling rate in the reception unit 10. If the window function is equal to or greater than the number of N samples expressed by the above expression, FFT can be performed without any problem in practical use, so that an asymmetric second window function W2 having the peak P2 separated as much as possible from the center of the window section to the left side by the number of N samples expressed by the above expression makes it possible to perform a highly reliable FFT.

(FFT Sweep Section Setting Unit)

Figure 7:
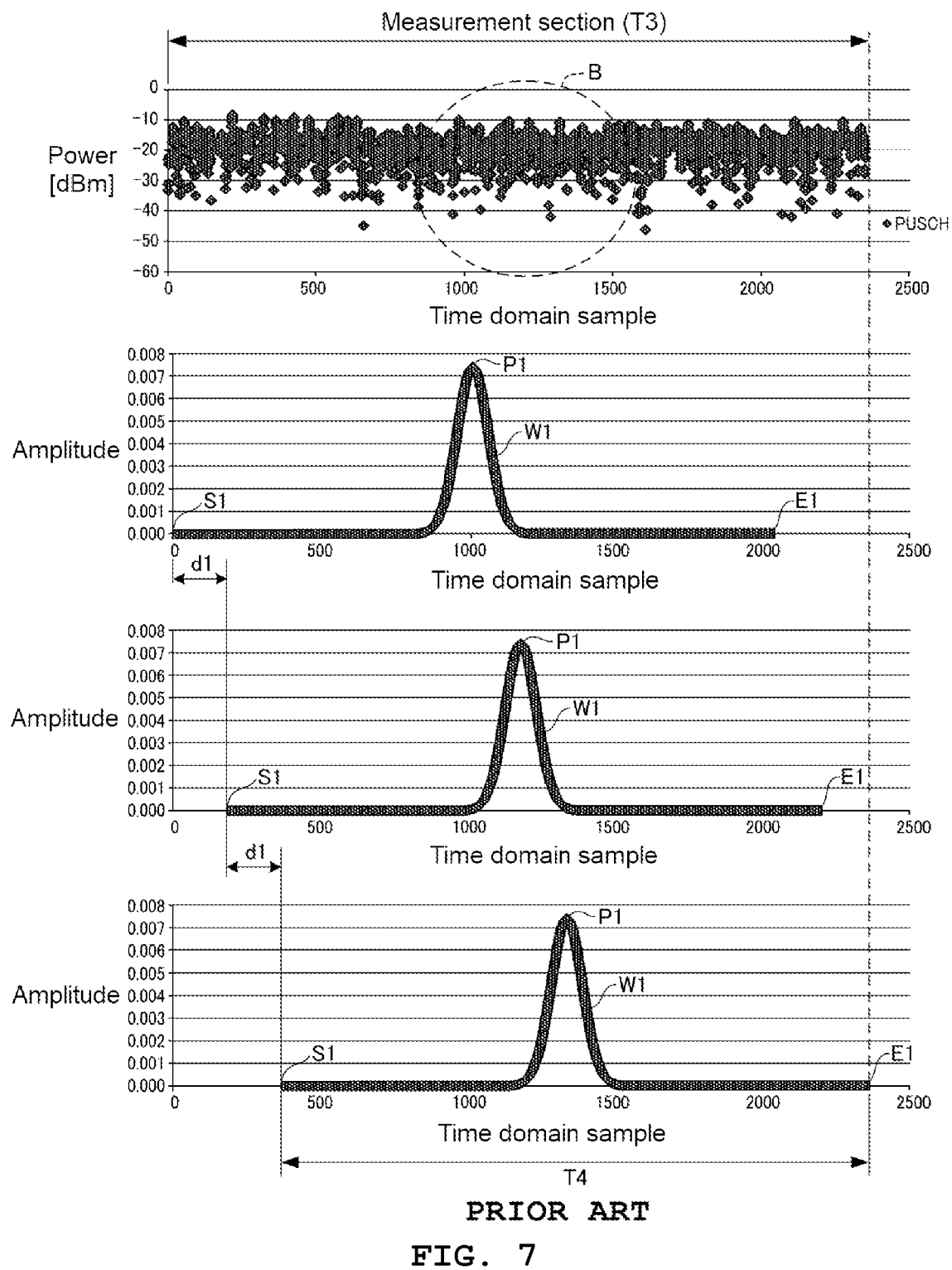
FIG. 7 is a diagram illustrating an FFT sweep in the related art.

FIG. 7 is a diagram illustrating an FFT sweep in the related art. The graph on the first stage shows the signal to be measured (PUSCH signal) of the signal length T3, that is, the measurement section T3. The FFT sweep section is equal to the measurement section. The graphs on the second, third, and fourth stages show states where the FFT operation is performed while shifting the window function W1 to the right by step d1 in the sweep section equal to the measurement section T3.

As shown in FIG. 7, the FFT sweep in the related art starts in the state where the start point (left end) S1 of the window function W1 is located at the start point (left end) of the measurement section, and ends in the state where the end point (right end) E1 of the window function W1 reaches the end point (right end) of the measurement section. The number of sweeps (the number of FFTs) in FIG. 7 is three. In the FFT sweep in the related art, the number of sweeps is small, the main lobe portion of the window function is applied only to the central portion B of the signal to be measured, and the highly reliable FFT is performed only in the central portion B, so that better results are not obtained even by averaging.

Figure 8:
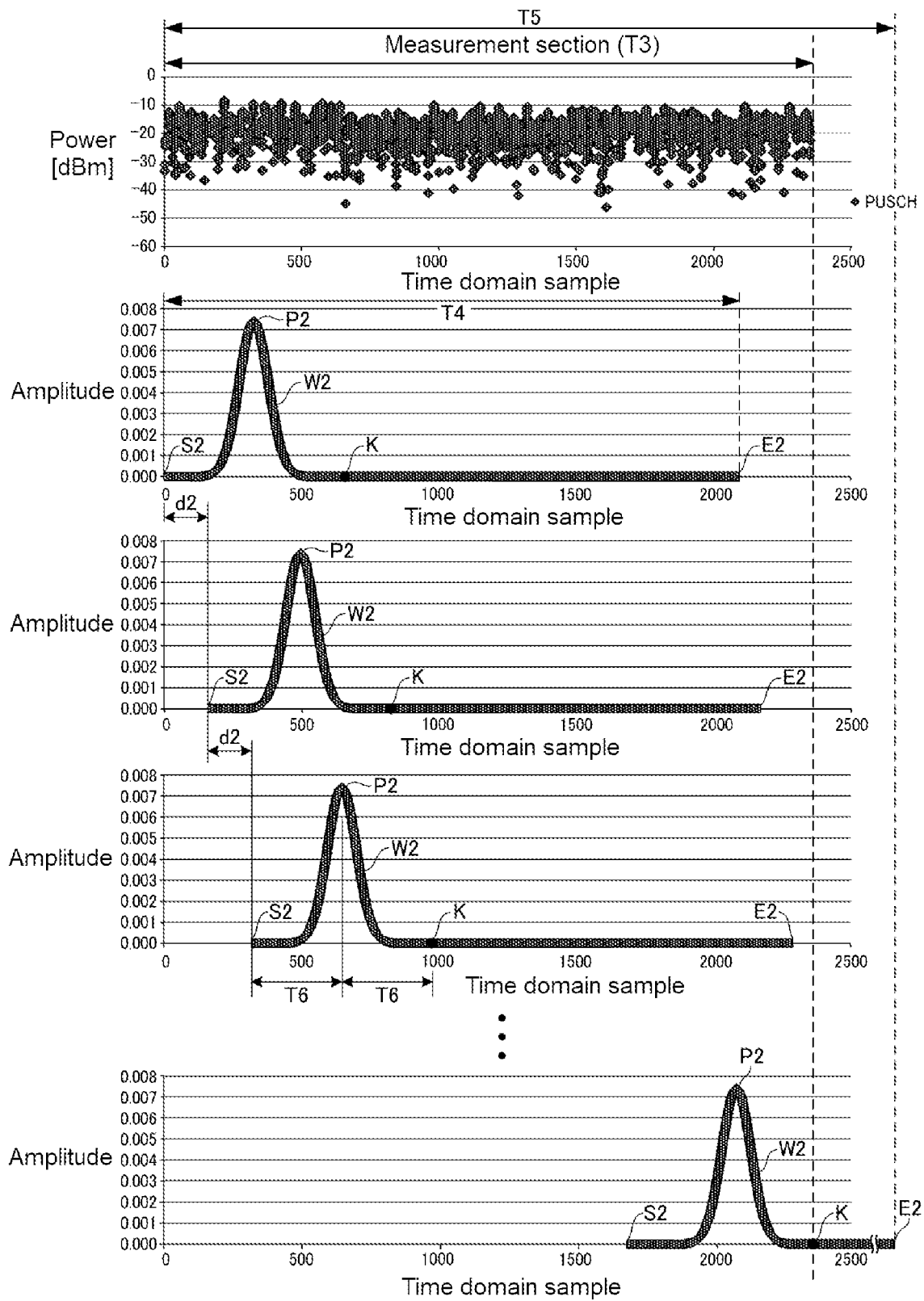
FIG. 8 is a diagram illustrating an FFT sweep according to the embodiment of the present invention.

FIG. 8 is a diagram illustrating an FFT sweep in the present embodiment. The graph on the first stage shows the signal to be measured (PUSCH signal) having the same measurement section (signal length) T3 as the signal to be measured of FIG. 7. The FFT sweep section is a section T5 obtained by extending the measurement section T3. The graphs on the second, third, fourth, and fifth stages show states where the FFT operation is performed while shifting an asymmetric second window function W2 to the right by step d2 in the sweep section T5.

As shown in FIG. 8, the FFT sweep in the present embodiment starts from the state where the start point (left end) S2 of the window function W2 is located at the start point (left end) of the sweep section T5 (graph on the second stage), and ends in the state where the end point (right end) E2 of the window function W2 reaches the end point (right end) of the sweep section T5 (graph on the fifth stage). The number of sweeps (the number of FFTs) in FIG. 8 has increased to 4 or more. In the FFT sweep in the present embodiment, the number of sweeps also increases, the main lobe portion of the window function is applied from the left end to the right end of the measurement section of the signal to be measured, and highly reliable FFT is performed in the entire measurement section, so that better results are obtained by averaging.

Specifically, when as the result of the comparison by the comparing unit 33, the signal length of the signal to be measured is shorter than the first FFT length, the FFT sweep section setting unit 36 sets a section T5 obtained by extending a measurement section T3 corresponding to the signal to be measured, as an FFT sweep section.

The sweep section T5 of the FFT obtained by extending the measurement section may be the section obtained by extending from the end point of the measurement section by the difference obtained by subtracting the value twice the section length T6 from the start point S2 to the peak point P2 of the second window function W2, from the section length T4 of the second window function W2. Specifically, in FIG. 8, the measurement section is extended by the section length from the point K to the end point E2. In this way, the main lobe portion of the second window function at the start of the FFT sweep and the position of the main lobe at the end of the FFT sweep are located at approximately the same distance from the left end and the right end of the measurement section, respectively. With this configuration, it is possible to perform a substantially effective FFT evenly from the start point (left end) to the end point (right end) of the measurement section.

Further, when as the result of the comparison by the comparing unit 33, the signal length of the signal to be measured is equal to or greater than the first FFT length, the FFT sweep section setting unit 36 sets the same section as the measurement section corresponding to the signal to be measured, as the FFT sweep section. In this case, the FFT sweep shown in FIG. 7 is performed.

<Spectrum Measurement ON/OFF>

Here, the ON/OFF setting of the spectrum measurement function will be described.

Figure 5A:
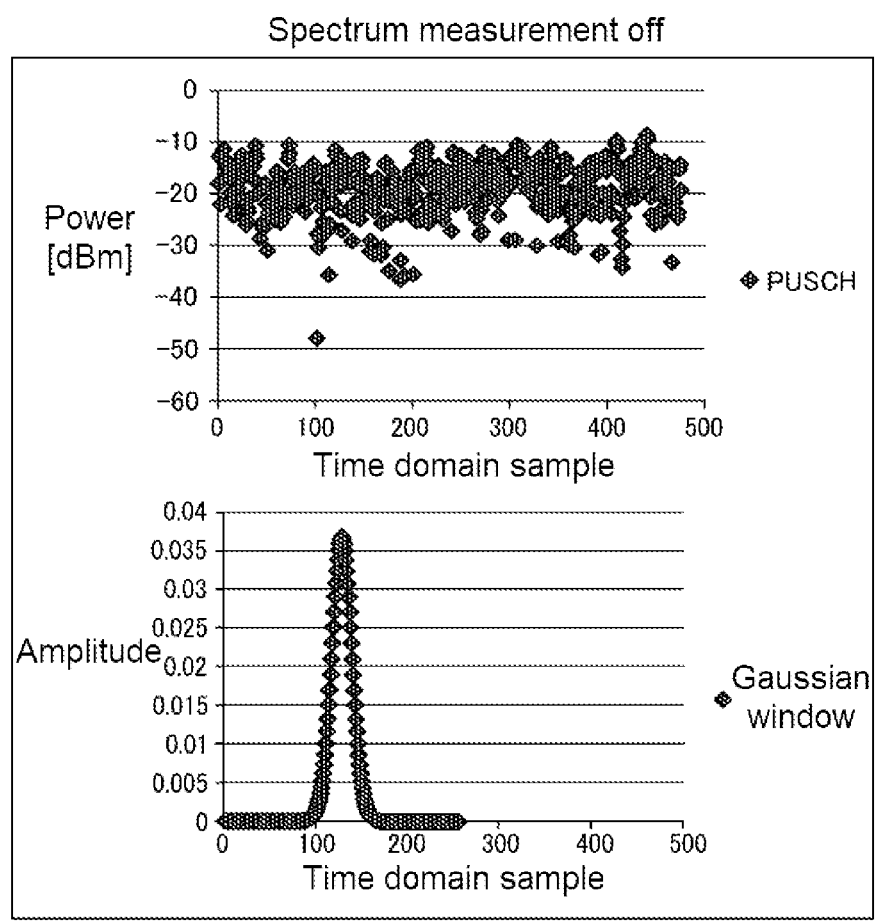
FIG. 5A is a diagram illustrating a relationship between the signal to be measured and the window function when a spectrum measurement function is OFF.
Figure 5B:
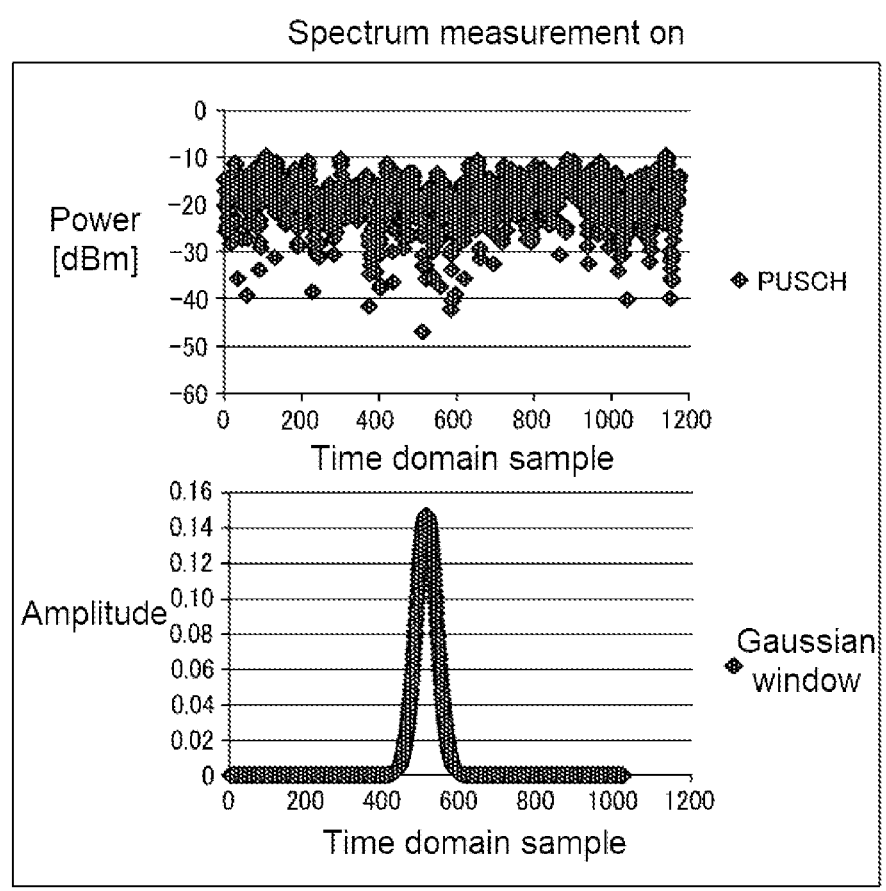

Generally, the mobile terminal test apparatus is provided with a spectrum measurement function and can set the spectrum measurement function to ON or OFF. FIG. 5A is a diagram illustrating the relationship between the signal to be measured (PUSCH) (upper figure) and the window function (lower figure) in the measurement section when the spectrum measurement is OFF, and FIG. 5B is a diagram illustrating the relationship between the signal to be measured (PUSCH) (upper figure) and the window function (lower figure) in the measurement section when the spectrum measurement is ON. The window function is a Gaussian window. As shown in FIGS. 5A and 5B, the sampling rate differs depending on whether the spectrum measurement is ON or OFF. The measurement sections when the spectrum measurement is ON and OFF have the same time length, although the numbers of samples are different.

As shown in FIGS. 5A and 5B, the ratio of the number of samples (section length) of the window function to the number of samples (section length) in the measurement section is larger when the spectrum measurement is ON than when the spectrum measurement is OFF. Therefore, when the spectrum measurement is ON, the number of times the FFT sweep is performed is reduced, and the place where the main lobe portion of the window function sweeps is also localized. In FIG. 5B, the main lobe portion of the window function sweeps only near the center of the measurement section. That is, the substantially effective FFT operation is performed only near the center of the measurement section. On the other hand, as shown in FIG. 5A, when the spectrum measurement is OFF, the number of sweeps can be increased, and the FFT sweep is performed evenly within the measurement section. Due to this, there is a difference in the power measurement result when the spectrum measurement is ON/OFF.

The spectrum measurement ON/OFF storage unit 37 stores information on "spectrum measurement ON/OFF" indicating whether to use the spectrum measurement function (ON) or not to use (OFF). The spectrum measurement ON/OFF may be automatically set by the control unit 70 as needed. The spectrum measurement ON/OFF information P is sent to the reception unit 10, the signal processing unit 20, the analysis unit 40, and the like as needed, and is used for setting each unit. For example, when the spectrum measurement is ON, the sampling rate in the A/D conversion unit 12 of the reception unit 10 is increased. Further, this information P may be sent to the window function setting unit 35 and the FFT sweep section setting unit 36 of the setting unit 30 and used for setting the window function and the FFT sweep section.

For example, when as the result of the comparison by the comparing unit 33, the signal length of the signal to be measured is shorter than the first FFT length, and information P stored in the spectrum measurement ON/OFF storage unit 37 is the spectrum measurement ON, the window function setting unit 35 may set, instead of a first window function used in the FFT process, an asymmetric second window function W2 having a peak P2 separated from the center of a window section to the start point S2 side (left end side), as a window function used in the FFT process.

Further, for example, when as the result of the comparison by the comparing unit 33, the signal length of the signal to be measured is shorter than the first FFT length, and the information P stored in the spectrum measurement ON/OFF storage unit 37 is the spectrum measurement ON, the FFT sweep section setting unit 36 may set a section T5 obtained by extending a measurement section T3 corresponding to the signal to be measured, as an FFT sweep section.

The mobile terminal test apparatus 1 and the receiving device 100 according to the present embodiment include individually or as a whole, a computer including, for example, a Central Processing Unit (CPU), a Read Only Memory (ROM), a Random Access Memory (RAM), an input/output interface, a storage device such as a hard disk, and the like. Thus, for example, some or all of the functions of the reception unit 10, the signal processing unit 20, the setting unit 30, the analysis unit 40, the display unit 50, the operation unit 60, the control unit 70, and the like can be achieved by reading the various processing programs stored in the ROM or the storage device into the RAM and executing the programs in the CPU.

Figure 9:
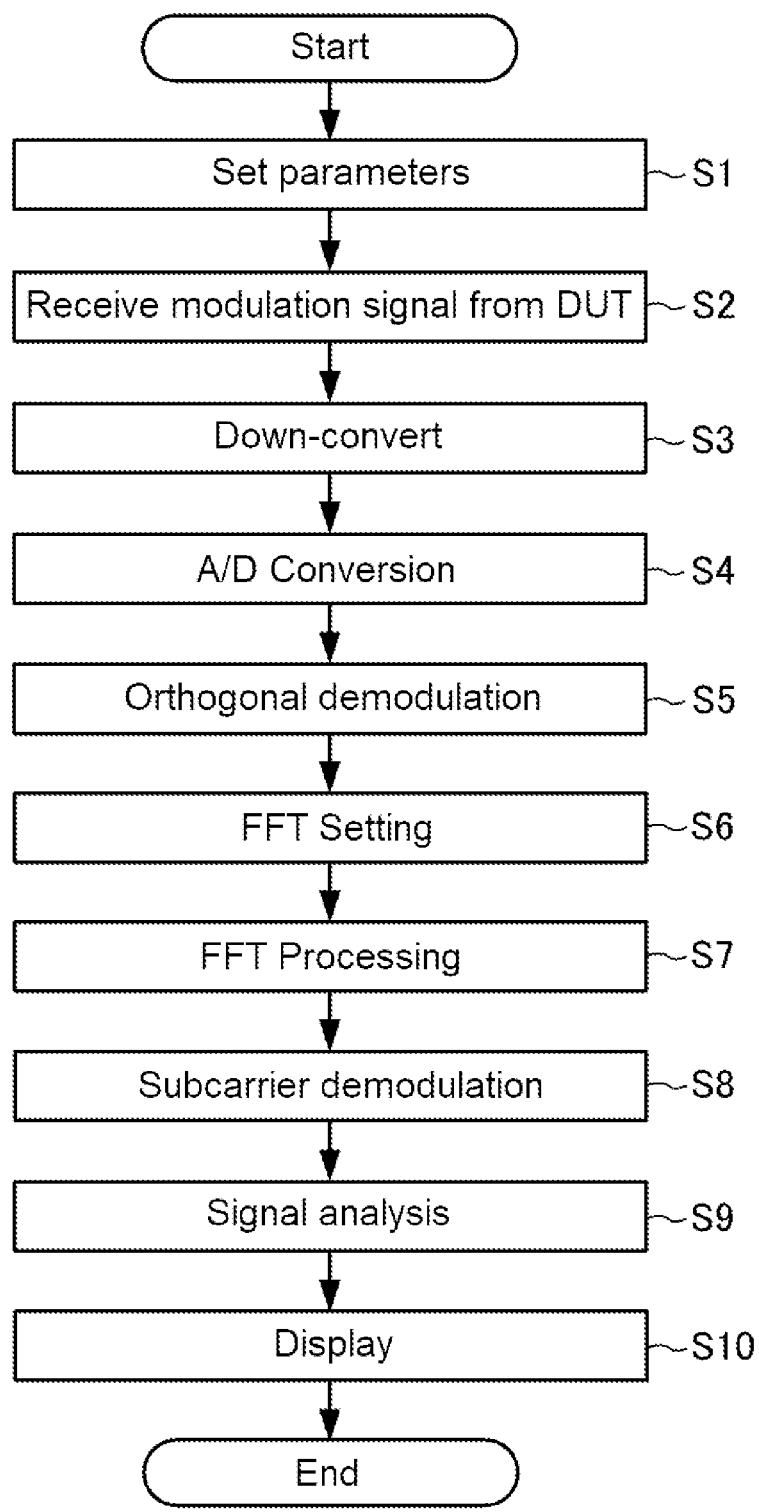
FIG. 9 is a diagram illustrating a flowchart of a mobile terminal test method according to the embodiment of the present invention.
Figure 10:
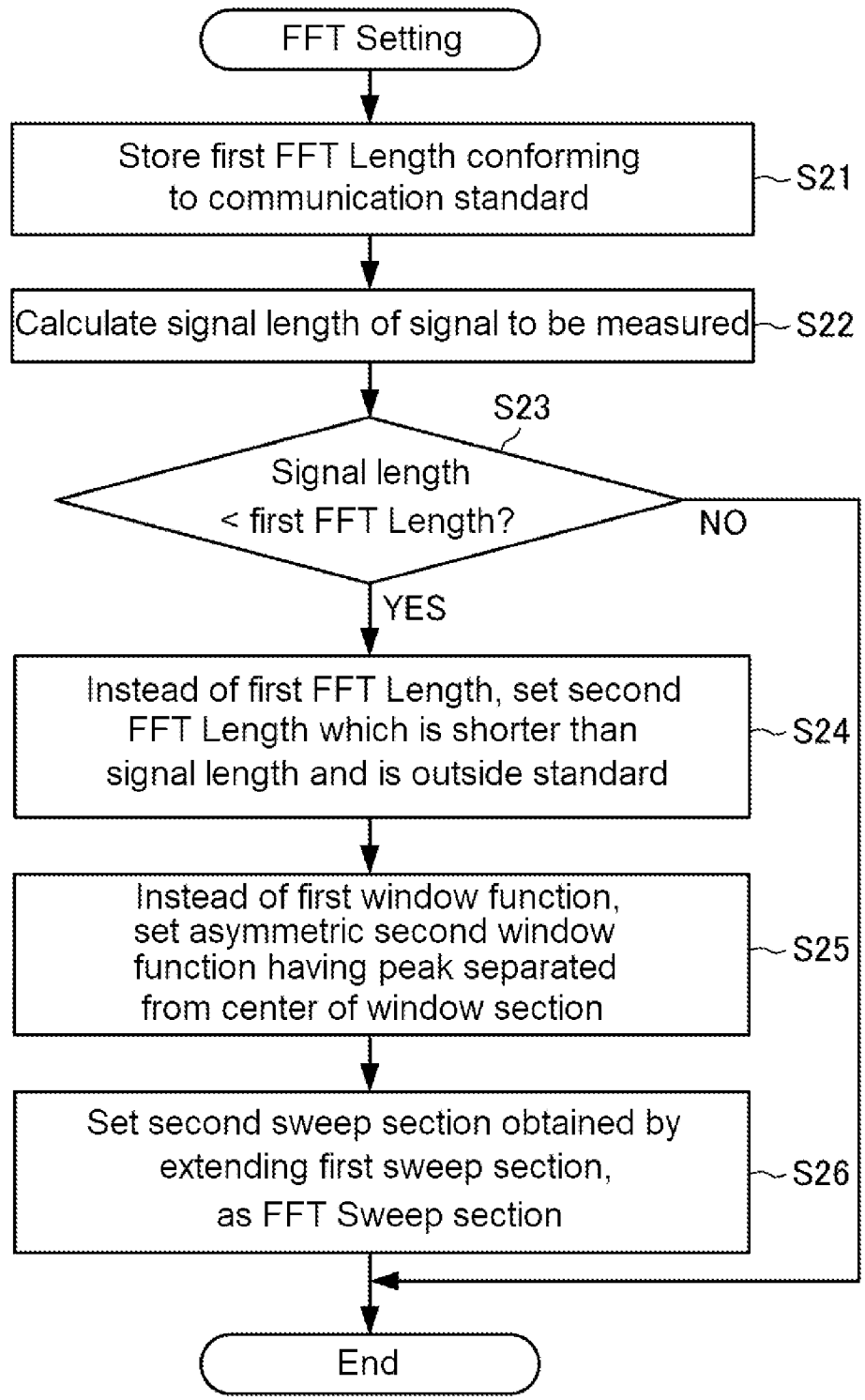
FIG. 10 is a diagram illustrating a flowchart of a mobile terminal test method according to the embodiment of the present invention.

Next, a mobile terminal test method performed using the mobile terminal test apparatus 1 according to the embodiment of the present invention will be described with reference to FIGS. 1, 9, and 10.

The user operates the operation unit 60 under the control of the control unit 70 to set various parameters such as spectrum measurement ON/OFF, in addition to measurement items, measurement conditions, and determination conditions when testing the DUT 2 (step S1).

The DUT 2 transmits a modulation signal a modulated by the OFDM modulation method, conforming to the communication standard. The DUT 2 may transmit a short modulation signal a outside the standard. The modulation signal a is also referred to as a signal to be measured.

The reception unit 10 receives the modulation signal a from the DUT 2 via the antenna or by wire (step S2). The received modulation signal a is sent to the down converter 11.

The down converter 11 down-converts the modulation signal a transmitted from the DUT 2 into an intermediate frequency signal b having an intermediate frequency (step S3). The intermediate frequency signal b is sent to the A/D conversion unit 12.

The A/D conversion unit 12 samples the analog intermediate frequency signal b to generate the digital intermediate frequency signal c (step S4). Sampling is performed, for example, 14640 times, 30720 times, or 61440 times per 14 symbols (1 slot). The digital intermediate frequency signal c is sent to the orthogonal demodulation unit 13.

The orthogonal demodulation unit 13 orthogonally demodulates the digital intermediate frequency signal c sent from the A/D conversion unit 12 to the baseband signal to generate an orthogonal demodulation signal d (step S5). The orthogonal demodulation signal d is a complex signal in the time domain and has an I-phase component and a Q-phase component. The orthogonal demodulation signal d is sent to the signal processing unit 20 and the setting unit 30. The orthogonal demodulation signal d may be temporarily stored in a storage device (not shown) and sent from the storage device to the signal processing unit 20 and the setting unit 30.

The setting unit 30 sets parameters that specify the FFT process performed by the FFT processing unit 21 of the signal processing unit 20, which will be described in detail later (step S6). For example, all or part of the FFT processing parameters such as the FFT length and the RBW of the window function may be initially set in the FFT processing unit 21, with parameters conforming to the communication standard as the default, or may be input by the user operating the operation unit 60.

The FFT processing unit 21 of the signal processing unit 20 performs an FFT process on the orthogonal demodulation signal d of the time domain output by the orthogonal demodulation unit 13 to acquire the frequency domain signal e (step S7). Specifically, the FFT processing unit 21 multiplies the time-series sample sequence constituting the orthogonal demodulation signal d by a window function to cut out the data sequence, and performs the FFT operation on the cut-out data sequence. While shifting the position (sample number) at which the window function is to be multiplied in the sample sequence by a predetermined step, the signal cutout and the FFT operation are repeated over the entire range of the sample sequence to acquire the frequency domain signal e. The frequency domain signal e is sent to the subcarrier demodulation unit 22, and, if necessary, the analysis unit 40.

The subcarrier demodulation unit 22 performs a demodulation process for each subcarrier from the frequency domain signal e to acquire the OFDM demodulation signal f (step S8). The demodulation process for each subcarrier is a demodulation process corresponding to the modulation method performed for each subcarrier in the DUT 2, and examples thereof include Binary Phase Shift Keying (BPSK), Quadrature Phase Shift Keying (QPSK), 8 Phase Shift Keying (PSK), 16 Quadrature Amplitude Modulation (QAM), 64QAM, and the like. The OFDM demodulation signal f is sent to the analysis unit 40.

The analysis unit 40 measures and analyzes, for example, transmission power, EVM, constellation, spectrum, and the like with respect to the OFDM demodulation signal f or the frequency domain signal e (step S9).

The display unit 50 displays information g such as measurement and analysis result data and graphs obtained by the analysis unit 40 in step S8 (step S10).

(Setting Process)

Next, the FFT setting process (step S6) by the setting unit 30 will be described with reference to FIG. 10.

The FFT length storage unit 32 stores a predetermined first FFT length conforming to the communication standard, which is set as the FFT length of the FFT process applied to the sample signal acquired by the reception unit 10 (step S21).

The signal length calculation unit 31 calculates the signal length of the signal to be measured, based on the sample sequence constituting the orthogonal demodulation signal d output from the orthogonal demodulation unit 13 (step S22). Specifically, the signal length calculation unit 31 compares, for example, the power of each sample of the orthogonal demodulation signal d with a predetermined reference value, and when the power is larger than the reference value, determines that the signal is transmitted from DUT 2. The signal length of the signal to be measured is obtained from the number of samples whose power is larger than the reference value.

Next, the comparing unit 33 compares the signal length of the signal to be measured with the first FFT length stored in the FFT length storage unit 32 (step S23).

As a result of comparison by the comparing unit 33, when the signal length of the signal to be measured is equal to or greater than the first FFT length (NO in step S23), the FFT length setting unit 34 ends the FFT setting process. In this case, the FFT length in the FFT process remains the first FFT length. Alternatively, when the signal length of the signal to be measured is equal to or greater than the first FFT length (NO in step S23), the FFT length setting unit 34 may return the setting to the first FFT length, when an FFT length other than the first FFT length is set.

When as a result of the comparison by the comparing unit 33, the signal length of the signal to be measured is shorter than the first FFT length (YES in step S23), the FFT length setting unit 34 sets, instead of the existing first FFT length, a second FFT length which is shorter than the signal length of the signal to be measured and is outside the standard, as the FFT length of the FFT process (step S24).

Specifically, the FFT length setting unit 34 sets the second FFT length to maximum $2^n$ which is the number of samples or less of one symbol at the sampling rate of the sampling performed by the reception unit 10. Where n is a natural number. By doing so, even when the signal length of the signal to be measured is only one symbol at worst, the FFT process can be appropriately performed. Further, since the second FFT length can be set to the shortest, the number of FFT sweeps can be increased.

Next, the window function setting unit 35 sets, instead of the first window function used in the FFT process, an asymmetric second window function having a peak separated from the center of the window section to the start point side (left end side), as a window function used in the FFT process (step S25).

The FFT sweep section setting unit 36 sets a section obtained by extending the end point side (right end side) of the measurement section corresponding to the signal to be measured, as the FFT sweep section (step S26).

When as the result of the comparison by the comparing unit 33, the signal length of the signal to be measured is equal to or greater than the first FFT length (NO in step S23), the FFT sweep section setting unit 36 may return the setting of the FFT sweep section to the same section as the measurement section corresponding to the signal to be measured.

Next, the action and effect will be described.

As described above, in the receiving device 100 and the mobile terminal test apparatus 1 according to the present embodiment, when the signal length of the signal to be measured is shorter than the first FFT length conforming to the communication standard, the FFT length setting unit 34 sets, instead of the first FFT length, a second FFT length that is shorter than the signal length of the signal to be measured, and is outside the standard, as the FFT length of the FFT process by the FFT processing unit 21. Further, when the signal length of the signal to be measured is shorter than the first FFT length, the window function setting unit 35 sets, instead of a first window function currently set as a window function used in the FFT process, an asymmetric second window function having a peak separated from the center of a window section to the start point side (left end side), as a window function used in the FFT process. With such a configuration, for example, a section (section deviated from the main lobe portion) that has not been subjected to substantially FFT on the start point side (left end side) of the symmetrical first window function is also subjected to FFT by using a second window function having a peak separated the start point side (left end side).

Further, in the receiving device 100 and the mobile terminal test apparatus 1 according to the present embodiment, when as the result of the comparison by the comparing unit 33, the signal length of the signal to be measured is shorter than the first FFT length, the FFT sweep section setting unit 36 sets a section obtained by extending a measurement section corresponding to the signal to be measured, as an FFT sweep section. When shifting the second window function to the end point side (right end side) during FFT sweep, the value of the zero padded part on the right side is 0, so that the FFT result is not affected even if this part exceeds the measurement section. With this configuration, a substantially effective FFT can be performed up to the right end of the measurement section.

Therefore, in the receiving device 100 and the mobile terminal test apparatus 1 according to the present embodiment are able to, in a test involving the FFT process, handle not only a signal to be measured conforming to the communication standard but also a case where the signal length of a signal to be measured is short outside the standard, and perform the FFT process with high reliability, regardless of whether the spectrum measurement function is used or not. Therefore, the test of the mobile communication terminal can be performed with high accuracy.

In the above embodiment, when the signal length of the signal to be measured is shorter than the first FFT length (condition A), the window function setting unit 35 sets an asymmetric second window function having a peak separated from the center of a window section to the start point side (left end side), instead of the currently set first window function, as a window function used in the FFT process, but the configuration is not limited to this.

For example, the window function setting unit 35 may be configured to set, when the ratio of the currently set FFT length to the signal length of the signal to be measured is larger than a predetermined reference value (condition B), that is, when the number of FFT sweeps cannot be increased, an asymmetric second window function having a peak separated from the center of a window section to the start point side (left end side), as a window function used in the FFT process, instead of the currently set first window function.

Further, for example, the window function setting unit 35 may be configured to set, when the spectrum measurement is ON (condition C), instead of the currently set first window function, an asymmetric second window function having a peak separated from the center of a window section to the start point side (left end side), as a window function used in the FFT process.

As in the window function setting unit 35, the FFT sweep section setting unit 36 sets, when the signal length of the signal to be measured is shorter than the first FFT length (condition A), a section obtained by extending a measurement section corresponding to the signal to be measured, as an FFT sweep section, but the configuration is not limited to this.

For example, the FFT sweep section setting unit 36 may be configured to set, when the ratio of the currently set FFT length to the signal length of the signal to be measured is larger than a predetermined reference value (condition B), that is, when the number of FFT sweeps cannot be increased, a section obtained by extending the measurement section corresponding to the signal to be measured as an FFT sweep section.

Further, for example, the FFT sweep section setting unit 36 may be configured to set, when the spectrum measurement is ON (condition C), a section obtained by extending the measurement section corresponding to the signal to be measured as the FFT sweep section.

The above conditions A, B, and C may be combined as operating conditions for the window function setting unit 35 and the FFT sweep section setting unit 36.

As described above, the present invention has an effect that it is possible to handle a case where the signal length of a signal to be measured is short outside the standard in a test involving an FFT process and perform an FFT process with high reliability, and is useful for a receiving device, a mobile terminal test apparatus provided with the receiving device, and a mobile terminal test method in general.

DESCRIPTION OF REFERENCE NUMERALS AND SIGNS

1 Test apparatus (mobile terminal test apparatus)
2 Device under test (DUT)
10 Reception unit
11 Down converter
12 A/D conversion unit
13 Orthogonal demodulation unit
20 Signal processing unit
21 FFT processing unit
22 Subcarrier demodulation unit
30 Setting unit
31 Signal length calculation unit
32 FFT length storage unit
33 Comparing unit
34 FFT length setting unit
35 Window function setting unit
36 FFT sweep section setting unit
37 Spectrum measurement ON/OFF storage unit
40 Analysis unit
50 Display unit
60 Operation unit
70 Control unit
100 Receiving device
a Modulation signal (signal to be measured)

b Intermediate frequency signal
c Digital intermediate frequency signal
d Orthogonal demodulation signal (sample signal)
e Frequency domain signal
f OFDM demodulation signal
P Spectrum measurement ON/OFF information
T1, T3 Time length of sample sequence (signal length of signal to be measured)
T2 Window function section width (first FFT length)
T4 window function section width (second FFT length)

What is claimed is:

1. A receiving device comprising:
a reception unit that samples a signal to be measured, transmitted from a device under test, and acquires a sample signal;
an Fast Fourier Transform (FFT) processing unit that performs an FFT process by multiplying the sample signal acquired by the reception unit by a window function;
a signal length calculation unit that calculates a signal length of the signal to be measured, from the sample signal acquired by the reception unit;
a comparing unit that compares the calculated signal length of the signal to be measured with a first FFT length conforming to a communication standard;
an FFT length setting unit that when as a result of the comparison by the comparing unit, the signal length of the signal to be measured is shorter than the first FFT length, instead of the first FFT length, sets a second FFT length shorter than the signal length of the signal to be measured, as an FFT length of the FFT process by the FFT processing unit; and
a window function setting unit that when as the result of the comparison by the comparing unit, the signal length of the signal to be measured is shorter than the first FFT length, instead of a first window function which is currently set as the window function used in the FFT process, sets an asymmetric second window function having a peak separated from a center of a window section, as the window function used in the FFT process.

2. The receiving device according to claim 1, wherein
a separation distance of the peak of the second window function from the center of the window section is the number of N samples indicated by the following expression, $$N = WL - \frac{3}{RBW} \times SamplingRate$$

where WL is a section length of the second window function, RBW is a resolution bandwidth of the second window function, and SamplingRate is a rate of the sampling by the reception unit.

3. The receiving device according to claim 1, wherein
the FFT processing unit performs the FFT process while shifting the set window function within an FFT sweep section, and
the receiving device further comprises
an FFT sweep section setting unit that when as the result of the comparison by the comparing unit, the signal length of the signal to be measured is shorter than the first FFT length, sets a section obtained by extending a measurement section corresponding to the signal to be measured, as the FFT sweep section.

4. The receiving device according to claim 2, wherein
the FFT processing unit performs the FFT process while shifting the set window function within an FFT sweep section, and
the receiving device further comprises
an FFT sweep section setting unit that when as the result of the comparison by the comparing unit, the signal length of the signal to be measured is shorter than the first FFT length, sets a section obtained by extending a measurement section corresponding to the signal to be measured, as the FFT sweep section.

5. The receiving device according to claim 3, wherein
the FFT sweep section obtained by extending the measurement section is a section obtained by extending the measurement section from an end point of the measurement section, by a difference obtained by subtracting a value twice a section length from a start point to a peak point of the second window function, from a section length of the second window function.

6. The receiving device according to claim 1, wherein
the FFT length setting unit sets the second FFT length to maximum $2^n$ which is the number of samples or less of one symbol at a sampling rate of the sampling performed by the reception unit, where n is a natural number.

7. The receiving device according to claim 2, wherein
the FFT length setting unit sets the second FFT length to maximum $2^n$ which is the number of samples or less of one symbol at a sampling rate of the sampling performed by the reception unit, where n is a natural number.

8. The receiving device according to claim 3, wherein
the FFT length setting unit sets the second FFT length to maximum $2^n$ which is the number of samples or less of one symbol at a sampling rate of the sampling performed by the reception unit, where n is a natural number.

9. The receiving device according to claim 4, wherein
the FFT length setting unit sets the second FFT length to maximum $2^n$ which is the number of samples or less of one symbol at a sampling rate of the sampling performed by the reception unit, where n is a natural number.

10. A mobile terminal test apparatus comprising:
a receiving device including
a reception unit that samples a signal to be measured, transmitted from a device under test, and acquires a sample signal,
an Fast Fourier Transform (FFT) processing unit that performs an FFT process by multiplying the sample signal acquired by the reception unit by a window function,
a signal length calculation unit that calculates a signal length of the signal to be measured from the sample signal acquired by the reception unit,
a comparing unit that compares the calculated signal length of the signal to be measured with a first FFT length conforming to a communication standard,
an FFT length setting unit that when as a result of the comparison by the comparing unit, the signal length of the signal to be measured is shorter than the first FFT length, instead of the first FFT length, sets a second FFT length shorter than the signal length of the signal to be measured, as an FFT length of the FFT process by the FFT processing unit, and
a window function setting unit that when as the result of the comparison by the comparing unit, the signal length of the signal to be measured is shorter than the first FFT length, instead of a first window function which is currently set as the window function used in the FFT process, sets an asymmetric second window function having a peak separated from a center of a window section, as the window function used in the FFT process;

an analysis unit that analyzes a signal obtained by the FFT processing unit; and a display unit that displays a result of the analysis performed by the analysis unit.

11. The mobile terminal test apparatus according to claim 10, wherein a separation distance of the peak of the second window function from the center of the window section is the number of N samples indicated by the following expression, $$N = WL - \frac{3}{RBW} \times SamplingRate$$

where WL is a section length of the second window function, RBW is a resolution bandwidth of the second window function, and SamplingRate is a rate of the sampling by the reception unit.

12. The mobile terminal test apparatus according to claim 10, wherein the FFT processing unit performs the FFT process while shifting the set window function within an FFT sweep section, and the receiving device further comprises an FFT sweep section setting unit that when as the result of the comparison by the comparing unit, the signal length of the signal to be measured is shorter than the first FFT length, sets a section obtained by extending a measurement section corresponding to the signal to be measured, as the FFT sweep section.

13. The mobile terminal test apparatus according to claim 12, wherein the FFT sweep section obtained by extending the measurement section is a section obtained by extending the measurement section from an end point of the measurement section, by a difference obtained by subtracting a value twice a section length from a start point to a peak point of the second window function, from a section length of the second window function.

14. The mobile terminal test apparatus according to claim 10, wherein the FFT length setting unit sets the second FFT length to maximum $2^n$ which is the number of samples or less of one symbol at a sampling rate of the sampling performed by the reception unit, where n is a natural number.

15. A mobile terminal test method comprising:

a reception step of sampling a signal to be measured, transmitted from a device under test, and acquiring a sample signal;

an Fast Fourier Transform (FFT) processing step of performing an FFT process by multiplying the sample signal acquired in the reception step by a window function;

a signal length calculation step of calculating a signal length of the signal to be measured from the sample signal acquired in the reception step;

a comparison step of comparing the calculated signal length of the signal to be measured with a first FFT length conforming to a communication standard as an FFT length of the FFT process;

an FFT length setting step of, when as a result of the comparison in the comparison step, the signal length of the signal to be measured is shorter than the first FFT length, instead of the first FFT length, setting a second FFT length shorter than the signal length of the signal to be measured, as the FFT length of the FFT process in the FFT processing step;

a window function setting step of, when as the result of the comparison in the comparison step, the signal length of the signal to be measured is shorter than the first FFT length, instead of a first window function which is currently set as the window function used in the FFT process, setting an asymmetric second window function having a peak separated from a center of a window section, as the window function used in the FFT process;

a sweep section setting step of, when as the result of the comparison in the comparison step, the signal length of the signal to be measured is shorter than the first FFT length, setting a section obtained by extending a measurement section corresponding to the signal to be measured, as an FFT sweep section;

an analysis step of analyzing a signal obtained in the FFT processing step; and a display step of displaying a result of analysis in the analysis step.

* * * * *